(12) United States Patent
Cho (10) Patent No.: US 6,847,556 B2
(45) Date of Patent: Jan. 25, 2005

(54) METHOD FOR OPERATING NOR TYPE FLASH MEMORY DEVICE INCLUDING SONOS CELLS

(75) Inventor: Myoung-kwan Cho, Gyungsangbuk-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/643,724

(22) Filed: Aug. 18, 2003

(65) Prior Publication Data

US 2004/0100826 A1 May 27, 2004

(30) Foreign Application Priority Data

Nov. 26, 2002 (KR) .............................. 10-2002-0073815

(51) Int. Cl.[7] .............................................. G11C 16/04
(52) U.S. Cl. ........................... 365/185.28; 365/185.18; 365/185.33
(58) Field of Search ...................... 365/185.28, 185.18, 365/185.29, 185.33

(56) References Cited

U.S. PATENT DOCUMENTS

| | | | | |
|---|---|---|---|---|
| 6,512,694 B2 | * | 1/2003 | Herdt | 365/185.18 |
| 6,587,380 B2 | * | 7/2003 | Kanai et al. | 365/185.18 |
| 6,768,681 B2 | * | 7/2004 | Kim | 365/185.28 |

* cited by examiner

Primary Examiner—Huan Hoang
(74) Attorney, Agent, or Firm—Marger Johnson & McCollom P.C.

(57) ABSTRACT

Provided is a method for operating a NOR-type flash memory device using SONOS cells. The SONOS cells are selectively programmed using channel hot electron injection and erased using Fowler-Nordheim tunneling and hot hole injection. When the SONOS cells are programmed, a voltage within a range of 8V–12V is applied to a selected word line and a voltage within a range of 3V–6V is applied to a selected bit line. When the SONOS cells are erased, the selected word line is ground and a voltage within a range of 13V–18V is applied to a substrate. Alternatively, a voltage of about −8V is applied to the selected word line, a voltage of about 6V is applied to the substrate, and a bit line and a source line float.

12 Claims, 7 Drawing Sheets

Si SUBSTRATE//SiO$_2$/Si$_3$N$_4$/SiO$_2$//GATE

METHOD FOR OPERATING NOR TYPE FLASH MEMORY DEVICE INCLUDING SONOS CELLS

BACKGROUND OF THE INVENTION

This application claims the priority of Korean Patent Application No. 2002-73815 filed on Nov. 26, 2002 in the Korean Intellectual Property Office, the disclosure of which is incorporated herein in its entirety by reference.

1. Field of the Invention

The present invention relates to a nonvolatile memory device, and more particularly, to a method for operating a NOR-type flash memory device having silicon-oxide-nitride-oxide-semiconductor (SONOS) cells.

2. Description of the Related Art

Nonvolatile semiconductor memory devices can have a variety of types which have a common characteristic in that after an applied power is removed from the nonvolatile semiconductor memory devices, the nonvolatile semiconductor memory devices can retain stored information. Of such nonvolatile semiconductor memory devices, a flash memory device can be largely classified into a NAND-type flash memory device and a NOR-type flash memory device according to the array form of unit cells. The NOR-type flash memory device has attracted much attention in terms of the advantageousness to the high integration. Unit cells of a flash memory device have been generally floating gate cells.

Figure 1:
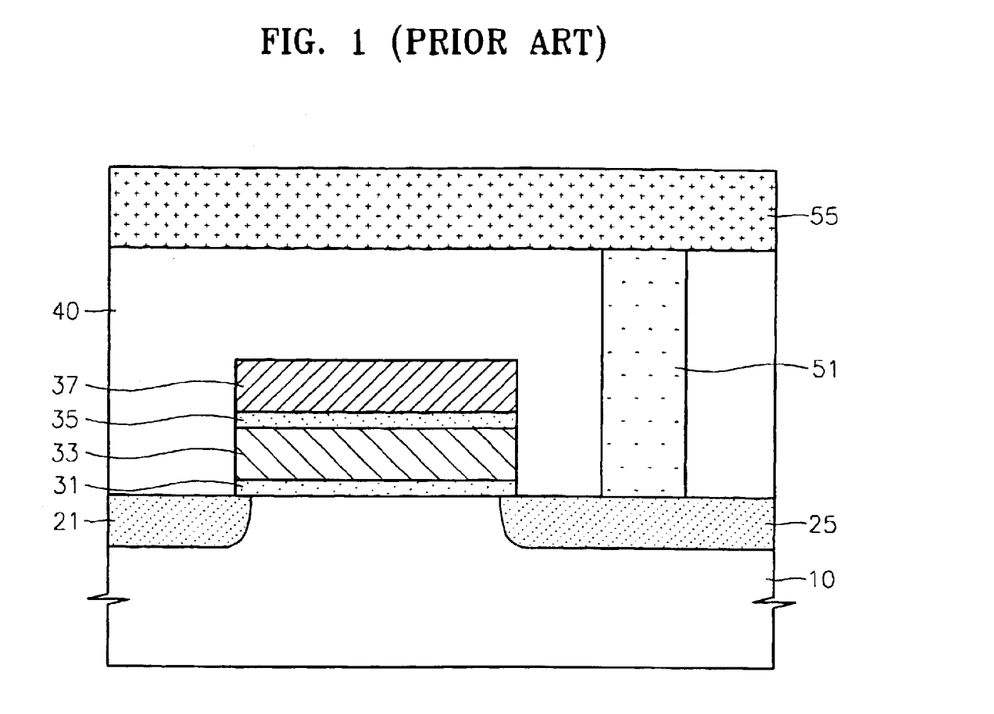
FIG. 1 is a schematic cross-sectional view explaining a conventional floating gate cell.

FIG. 1 is a schematic cross-sectional view explaining a conventional floating gate cell. As shown in FIG. 1, in the conventional floating gate cell, a source 21 and a drain 25 are formed in a substrate 10. A floating gate 33 and a control gate 37 are formed over a portion of the substrate 1 between the source 21 and the drain 25. A gate dielectric layer 31 is formed of silicon oxide between the floating gate 33 and the substrate 10. An interlayer insulating layer 35 is formed of oxide-nitride-oxide (ONO) between the floating gate 33 and the control gate 37. A bit line 55 is electrically connected to the drain 25 via a contact 51 the rest of the structure being surrounded by an insulating layer 40.

The floating gate cell stores information by charging/discharging the floating gate 33 to dualize a threshold voltage $V_{th}$. In other words, when the floating gate 33 is charged with electrons, a voltage is applied to the control gate 37. Then, the applied voltage is screened by the charged electrons, and thus a threshold voltage $V_{th}$ of a channel under the floating gate 33 and the control gate 37 increases. In contrast, in the case where the floating gate 33 has no electrons, the threshold voltage $V_{th}$ is decreases. Due to an increase or a decrease in the threshold voltage $V_{th}$, a digital signal of 1/0 is stored.

However, since the control gate 37 is stacked over the floating gate 33, the floating gate cell has several limitations. For example, a complicated process is required to form the floating gate 33 over the control gate 37. Also, it is difficult to highly integrate a memory device. Thus, much research on realizing a new type of flash memory device has been attempted.

SUMMARY OF THE INVENTION

Accordingly, the present invention provides a method for operating a NOR-type flash memory device which uses silicon-oxide-nitride-oxide-semiconductor (SONOS) cells to improve the integration and process thereof.

According to an aspect of the present invention, there is provided a method for operating a flash memory device that is constituted by arraying SONOS memory cells including a drain and a source formed in a substrate, a channel formed between the drain and the source, a gate formed over the channel, and a multi-layered dielectric layer of an oxide layer, a nitride layer, and an oxide layer formed between the gate and the substrate in the NOR form. Voltages are applied to one selected from the SONOS memory cells and the selected SONOS memory cell is programmed so that hot electrons are injected into the interface between the oxide layer and the nitride layer or into the nitride layer from the channel and trapped in the interface between the oxide layer and the nitride layer or in the nitride layer to increase a threshold voltage. A positive voltage is applied to the substrate, a ground voltage or a negative voltage is applied to the gate and the source or the drain floats to reduce the threshold voltage so as to remove the trapped electrons from the interface between the oxide layer and the nitride layer or the nitride layer using Fowler-Nordheim tunneling or/and erase the trapped electrons by injecting hot holes created between the source and the substrate or between the drain and the substrate under the voltage condition into the multi-layered dielectric layer.

Here, when the selected SONOS cell is programmed, a voltage may be applied to the selected SONOS cell in a condition that a voltage within a range of 8V–12V is applied to the gate of the selected SONOS cell, a voltage within a range of 3V–6V is applied to the drain, and the source is ground. The condition further includes grounding the substrate or applying a negative voltage to the substrate.

When erasing the trapped electrons, the gate of the selected SONOS memory cell is ground and a voltage within a range of 13V–18V is applied to the substrate. When erasing the trapped electrons, a voltage of about −8V is applied to the gate of the selected SONOS memory cell, a voltage of about 6V is applied to the substrate, and the source is ground.

According to another aspect of the present invention, there is also provided a method for operating a flash memory cell that is constituted by arraying SONOS memory cells including a drain and a source formed in a substrate, a channel formed between the drain and the source, a gate formed over the channel, and a multi-layered dielectric layer of an oxide layer, a nitride layer, and an oxide layer formed between the gate and the substrate in the NOR form, wherein drains of the SONOS memory cells are electrically connected to a bit line, gates of the SONOS memory cells are electrically connected to a word line crossing the bit line, sources of the SONOS memory cells connected to the word line are connected to a common source line. A voltage is applied to one selected from the SONOS memory cells and the selected SONOS memory cell is programmed so that hot electrons are injected into the interface between the oxide layer and the nitride layer or into the nitride layer from the channel and trapped in the interface between the oxide layer and the nitride layer or in the nitride layer to increase a threshold voltage. A positive voltage is applied to the substrate, a ground voltage or a negative voltage is applied to the gate and the source or the bit line floats to reduce the threshold voltage so as to remove the trapped electrons from the interface between the oxide layer and the nitride layer or the nitride layer using Fowler-Nordheim tunneling or/and erase the trapped electrons by injecting hot holes created between the source and the substrate or between the drain and the substrate under the voltage condition into the multi-layered dielectric layer.

Here, when programming the selected SONOS memory cell, the voltage may be applied to the selected SONOS memory cell in a condition that a word line is selected and a voltage within a range of 8V–12V is applied to the selected word line, a bit line is selected and a voltage within a range of 3V–6V is applied to the selected bit line, and the common source line is ground.

When erasing the trapped electrons, the word line may be ground and a voltage within a range of 13V–18V may be applied to the substrate. When erasing the trapped electrons, a voltage of about –8V may be applied to the selected word line connected to the selected SONOS memory cell and a voltage of about 6V may be applied to the substrate.

According to the present invention, provided can be a method for operating a flash memory device in which SONOS memory cells are arrayed in the NOR form. Thus, the flash memory device can be highly integrated.

BRIEF DESCRIPTION OF THE DRAWINGS

The above features and advantages of the present invention will become more apparent by describing in detail exemplary embodiments thereof with reference to the attached drawings in which.

DETAILED DESCRIPTION OF THE INVENTION

Hereinafter, embodiments of the present invention will be described in detail with reference to the attached drawings.

However, the embodiments of the present invention can be modified into various other forms, and the scope of the present invention must not be interpreted as being restricted to the embodiments. The embodiments are provided to more completely explain the present invention to those skilled in the art. In drawings, the thicknesses of layers or regions are exaggerated for clarity. Like reference numerals in the drawings denote the same members. Also, when it is written that a layer is formed "on" another layer or a substrate, the layer can be formed directly on the other layer or the substrate, or other layers can intervene therebetween.

In embodiments of the present invention, silicon-oxide-nitride-oxide-semiconductor (SONOS) cells are used as unit cells in a NOR-type flash memory device. A solution to problems, which must be solved before the NOR-type flash memory device is constituted, is suggested. In other words, a method of programming and erasing the NOR-type flash memory device using the SONOS cells is provided.

The SONOS cells may be treated as being similar to floating gate cells and have attracted much attention as substitutes for the floating gate cells to configure a non-volatile memory device. The SONOS cells have a stack of silicon-oxide-nitride-oxide-semiconductor. The structure of the SONOS cells and an energy band diagram associated with the SONOS cells may be generally as shown FIGS. 2 and 3.

Figure 2:
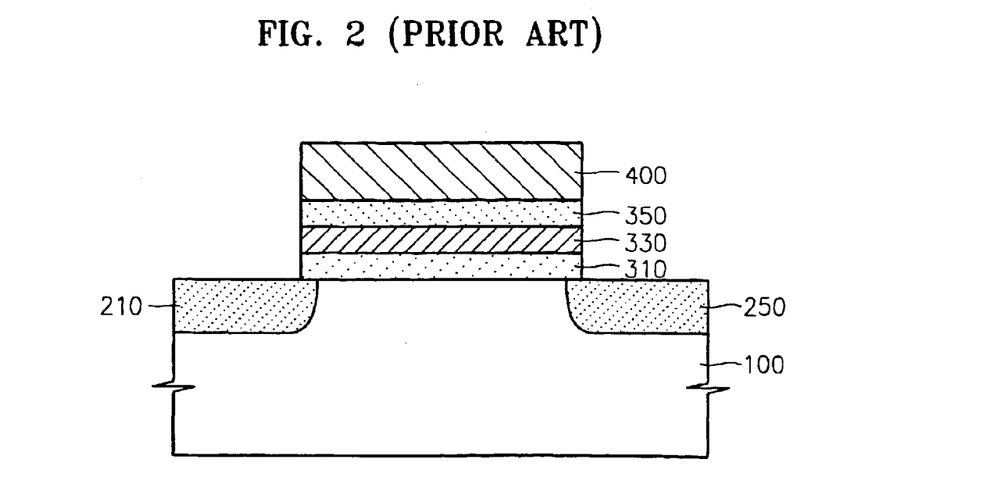
FIG. 2 is a schematic cross-sectional view explaining a conventional SONOS memory cell.
Figure 3:
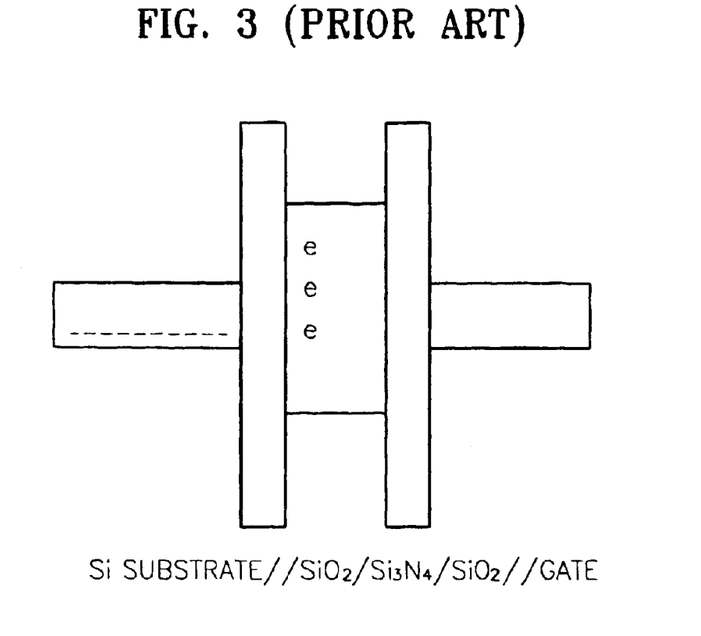
FIG. 3 is a schematic view illustrating an energy band diagram associated with the SONOS memory cell shown in FIG. 2.

FIG. 2 is a schematic cross-sectional view explaining the configuration of a conventional SONOS cell, and FIG. 3 is a schematic view illustrating an energy band diagram associated with the SONOS cell shown in FIG. 2. Referring to FIGS. 2 and 3, an SONOS cell is constituted by forming a source 210 and a drain 250 in a substrate 100 and forming a gate 400 over the substrate 100. Here, the substrate 100 is preferably formed of silicon. A silicon oxide ($SiO_2$) layer 310, a silicon nitride ($Si_3N_4$) layer 330, and a silicon oxide layer 350 are sequentially stacked between the gate 400 and the substrate 100. In the SONOS cell, a threshold voltage $V_{th}$ is changed by trapping charge in the interface between the silicon oxide layer 310 ad the silicon nitride layer 330. Here, a trap site existing in the interface between the silicon nitride layer 330 and the silicon oxide layer or in the silicon nitride layer 33 operates as a charge storage site such as a floating gate. Due to a simple process and the compatibility with a logic process, much research on such a SONOS cell has been carried out. Nevertheless, the use of SONOS cells in a flash memory device is very difficult. In particular, it is difficult to use the SONOS cells in the flash memory device before many problems cased by characteristics of operating the flash memory device are solved.

Figure 4:
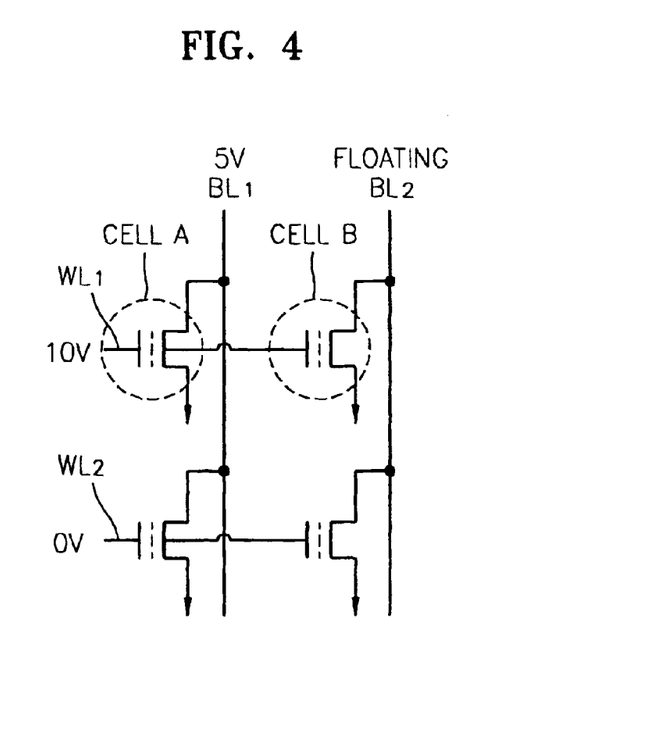
FIG. 4 is a schematic equivalent circuit diagram explaining a flash memory device in which SONOS cells are arrayed in the NOR form according to an embodiment of the present invention.

In an embodiment of the present invention, provided is a method for operating a flash memory device of non-volatile semiconductor memory devices in which SONOS cells are arrayed in the NOR form as shown in FIG. 4.

FIG. 4 is a schematic equivalent circuit diagram explaining a flash memory device in which SONOS cells are arrayed in the NOR form according to the embodiment of the present invention. Referring to FIG. 4, each of SONOS cells is arrayed with an adjacent SONOS cell in the NOR form. In other words, drains of a plurality of SONOS cells are electrically connected to any one of bit lines. Gates of a plurality of SONOS cells are electrically connected to a word line crossing the bit line. A common source is formed in the direction of the word line so as to connect sources of the plurality of SONOS cells connected to the word line.

In order to realize the flash memory device in which the SONOS cells are arrayed in the NOR form, problems of operating the flash memory device have to be solved.

A simple SONOS cell can operate by programming and erasing the simple SONOS cell using Fowler-Nordheim (F-N) tunneling. However, a method of programming and erasing the flash memory device, in which a plurality of SONOS cells are arrayed in the NOR form, using F-N tunneling encounters a new problem. In other words, since a specific SONOS cell of the plurality of SONOS cells cannot be selectively programmed using F-N tunneling, it is impossible to program the flash memory device.

Figure 5:
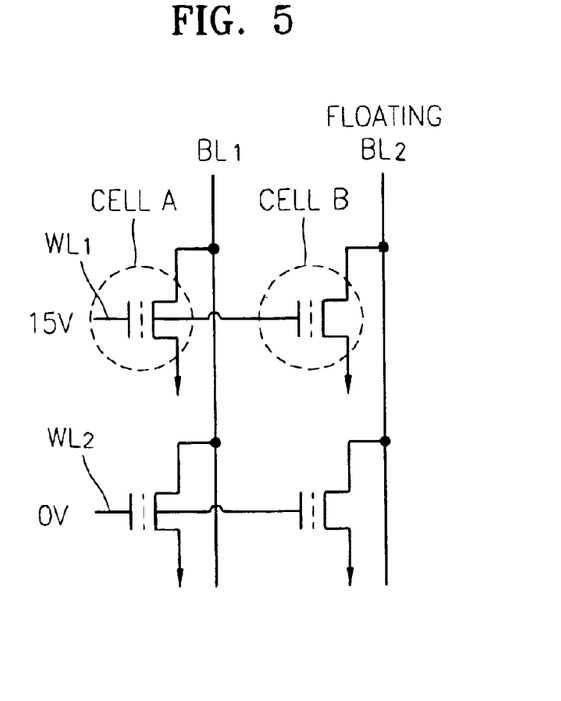
FIG. 5 is a schematic equivalent circuit diagram explaining problems which may occur when the flash memory device having the NOR-type SONOS cells according to the embodiment of the present invention is programmed using Fowler-Nordheim tunneling.
Figure 6:
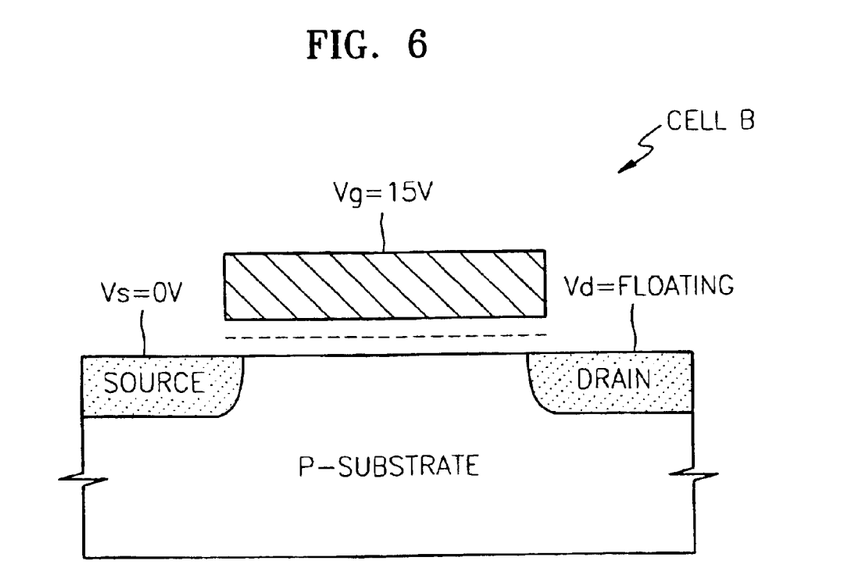
FIG. 6 is a schematic cross-sectional view explaining a disturbance in a cell B shown in FIG. 5.

FIG. 5 is a schematic equivalent circuit diagram explaining problems occurring when programming a flash memory device, in which SONOS cells are arrayed in the NOR form, using F-N tunneling according to another embodiment of the present invention. FIG. 6 is a schematic cross-sectional view explaining a disturbance in a cell B shown in FIG. 5. Referring to FIG. 5, when F-N tunneling is used to operate SONOS cells arrayed in the NOR form, it is impossible to selectively program one of the SONOS cells using F-N tunneling. In case where a cell A shown in FIG. 5 is selectively programmed using F-N tunneling, a high voltage of 15V is applied to a selected word line $WL_1$ and a voltage of 0V is applied to a bit line $BL_1$ connected to the cell A and a common source line.

However, a channel of a cell B unselected as well as a channel of the cell A is inverted as shown in FIG. 6, and thus a voltage of the channel of the cell B becomes 0V. In other words, as shown in FIG. 6, when a voltage of 15V is applied to the word lien $WL_1$ connected to the cell A, a voltage of 15V is also applied to the cell B connected to the word line $WL_1$. Since 0V is applied to the common source line, 0V is also applied to a source of the cell B. Since a bit line $BL_2$ connected to the cell B is not selected, the bit line $BL_2$ floats. Like this, the conditions of applying voltages to the cell B are the same as the cell A. Thus, the channel of the cell B is inverted and the voltage of the channel of the cell B becomes 0V.

Accordingly, the cell B as well as the cell A is programmed. Substantially, all of cells connected to a word line $WL_1$ selected are programmed. Therefore, it is impossible to selectively program an independent cell. As a result, the application of an F-N program operation is substantially impossible to the NOR-type cell array.

In this embodiment of the present invention, SONOS cells are separately programmed using channel hot electron (CHE) injection to operate a NOR-type flash memory device using the SONOS cells. Also, the SONOS cells are erased at a time using F-N tunneling. The method for operating the NOR-type flash memory is summarized in Table 1.

|  | Selected WL | Un-selected WL | Selected BL | Un-selected BL | Common source line | Substrate |
|---|---|---|---|---|---|---|
| Program | 10–11 V | 0 V | 3–6 V | Floating | 0 V | 0 V |
| Erase | 0/–8 V | 0 V | Floating | Floating | Floating | 14/6 V |
| Read | Vcc | 0 V | 0.5–1.5 V | Floating | 0 V | 0 V |

As seen in Table 1 and FIG. 4, in a programming operating, when the cell A is selected, a voltage of 10V (if necessary, about 8–12V) is applied to the word line $WL_1$ and a voltage of 5V (if necessary, about 3–6V) is applied to the bit line $BL_1$. Here, 0V is applied to the common source line, the bit line $BL_2$ connected to the cell B unselected floats, and the substrate may be ground or supplied with a negative voltage.

After the programming operation, the cell A is inverted by the voltage applied to the word line $WL_1$, and thus a channel is formed under gates of the cell A. Electrons in an inversion layer of the channel are accelerated by the voltage applied to the bit line $BL_1$. A portion of the accelerated electrons has an electron temperature higher than a lattice temperature of the substrate 100 formed of silicon.

Figure 7:
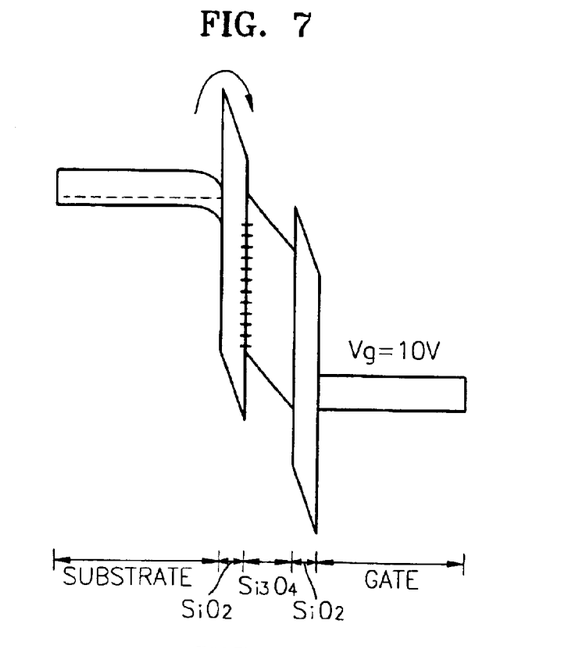
FIG. 7 is a schematic view illustrating an energy band diagram related to the SONOS cells, according to the embodiment of the present invention, when the flash memory device is programmed.

As shown in FIG. 7, energetic electrons go over an energy barrier of the silicon oxide layer (310 of FIG. 2) and are trapped in the interface between the silicon oxide layer (310 of FIG. 2) and the silicon nitride layer (330 of FIG. 2).

FIG. 7 is a schematic view of an energy band diagram associated with a SONOS cell, according to the embodiment of the present invention, when the flash memory cell is programmed. Referring to FIG. 7, sine electrons go over an energy barrier of silicon oxide and are trapped in the interface between silicon oxide and silicon nitride, a threshold voltage $V_{th}$ of the cell A increases, which means the operation of a program.

As shown in FIG. 4 and Table 1, the bit line $BL_2$ of the cell B representing unselected cells floats when operating the program. Since the cell B is connected to the selected word line $WL_1$, a voltage of 10V is applied to a gate of the cell B. Thus, an inversion layer is formed in a channel under the gate of the cell B and a potential of the channel may become 0V.

However, although the potential of the channel is maintained at 0V, the bit line $BL_2$ connected to the cell B floats. Thus, electrons of the channel are not activated and not injected into the interface between the silicon oxide layer (310 of FIG. 2) and the silicon nitride layer (330 of FIG. 2). Only a voltage of 10V is substantially applied to the gate. The voltage of 10V cannot induce the electrons of the channel to go over the energy barrier of the silicon oxide layer 310. Thus, the cell B is not programmed.

Due to this result, the programming operation according to the embodiment of the present invention can selectively program a separate SONOS cell so as to substantially program a flash memory device in which SONOS cells are arrayed in the NOR form. The speed for programming the SONOS cells is show in FIG. 8.

Figure 8:
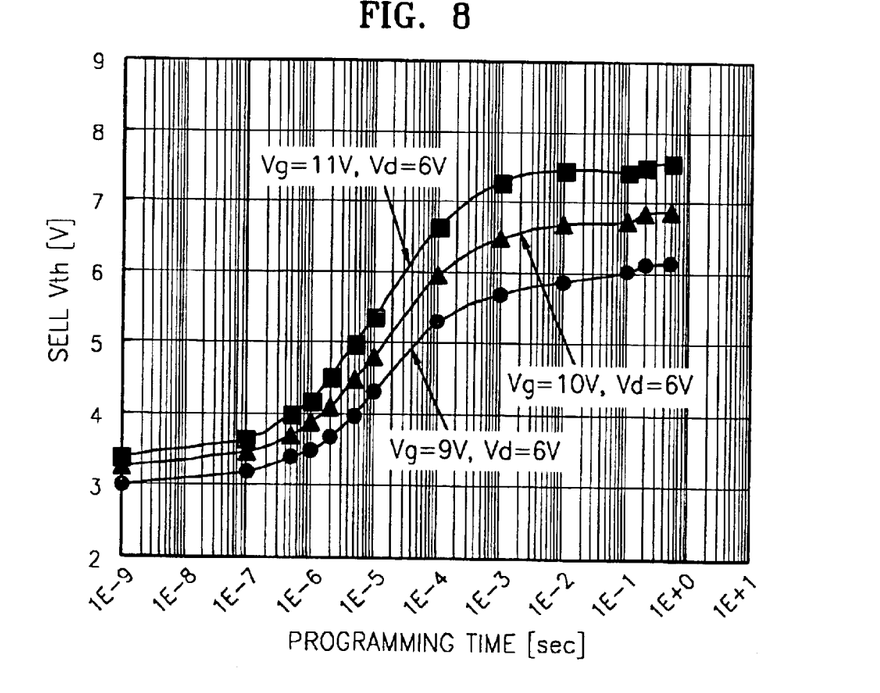
FIG. 8 is a graph illustrating speeds for programming the SONOS cells according to the embodiment of the present invention.

FIG. 8 shows the speed for programming SONOS cells according to the embodiment of the present invention. Referring to FIG. 8, when voltages are applied to a gate and a drain, a channel is inverted by the gate voltage, and accelerated electrons obtain energy due to the drain voltage and are trapped in the interface between a silicon oxide layer and a silicon nitride layer. As time passes, a threshold voltage $V_{th}$ is shifted, which is shown in FIG. 8. In a reading operation for reading the program, Vcc is applied to a selected word line and a voltage within a range of 0.5–1.5 V is applied to a selected bit line.

The flash memory device has to operate in consideration of the programming operation and an erasing operation.

Figure 9:
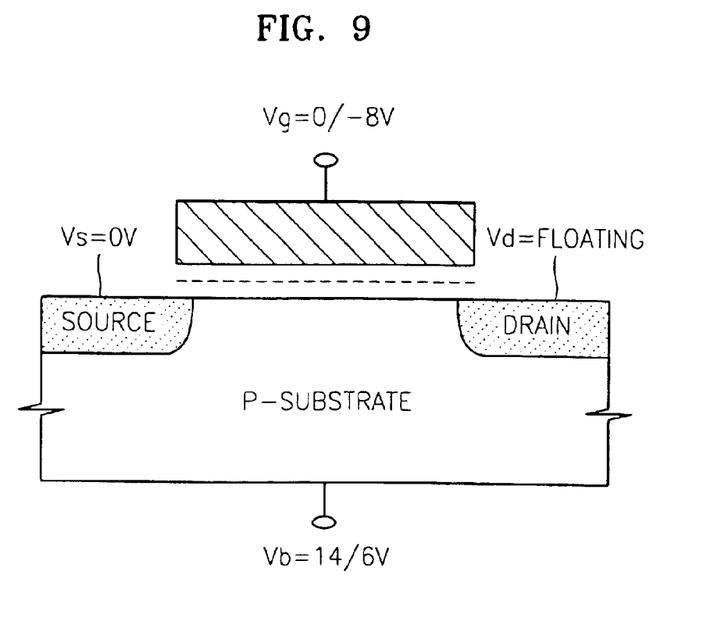
FIG. 9 is a schematic cross-sectional view illustrating conditions for erasing the SONOS cells according to the embodiment of the present invention.

FIG. 9 is a schematic cross-sectional view explaining the conditions for erasing a SONOS cell according to the embodiment of the present invention. Referring to FIG. 9 and Table 1, the erasing operation uses F-N tunneling and a hot hole injection effect. In detail, the erasing operation may be performed by applying a ground voltage to a selected word line $WL_1$, applying a voltage within a range of 13–18V, preferably, about 14V, to the substrate, and discharging trapped electrons in a channel direction to lower the threshold voltage $V_{th}$. For the convenience of a drive circuit, the erasing operation may apply voltages to a gate of a cell and the substrate. For example, the erasing operation may be performed by applying about 6V to a P-type substrate and about −8V to the gate.

In the erasing operation, F-N tunneling and a hot hole erasing effect occur, which improves the erasing operation.

Figure 10:
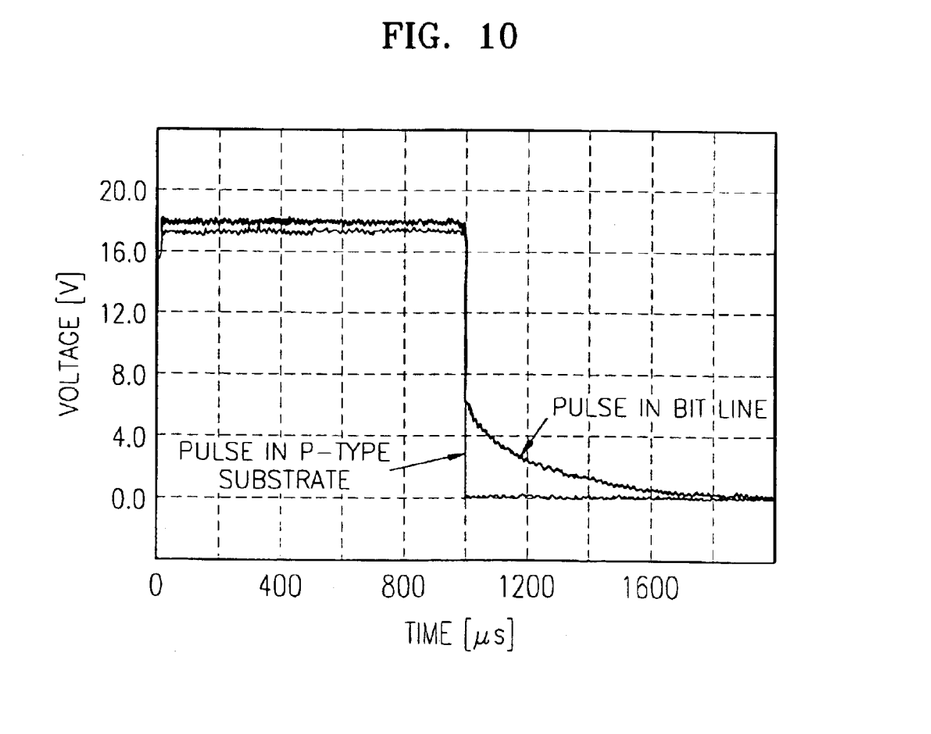
FIG. 10 is a graph illustrating voltages of a substrate, a bit line, and a source line measured with an oscilloscope in the erasing operation.

FIG. 10 is a graph illustrating voltages of the substrate, the bit line, and the source line in the erasing operation, according to the embodiment of the present invention, measured with an oscilloscope. Referring to FIG. 10, when a positive voltage is applied to the substrate, voltages of the substrate, the bit lines, and the source line are measured with an oscilloscope. The positive voltage is boosted to about 16V and drops to 0V without a delay time.

Voltages of floated bit line and source line have a different boosting and dropping characteristic from the voltage of the substrate. Here, the voltages of the bit line and source line are boosted to 15.3V small by a built-in voltage 0.7V of a P-N junction. This boosting and dropping characteristic is a well-known theory and phenomenon. Nevertheless, the voltages of the floated bit line and source line drop delaying more than the voltage of the substrate.

This delay phenomenon results from the discharging of charge of capacitance connected to the bit line. A particular voltage is applied to a cell during this delay time. The particular voltage is as shown in FIGS. 11 and 12.

Figure 11:
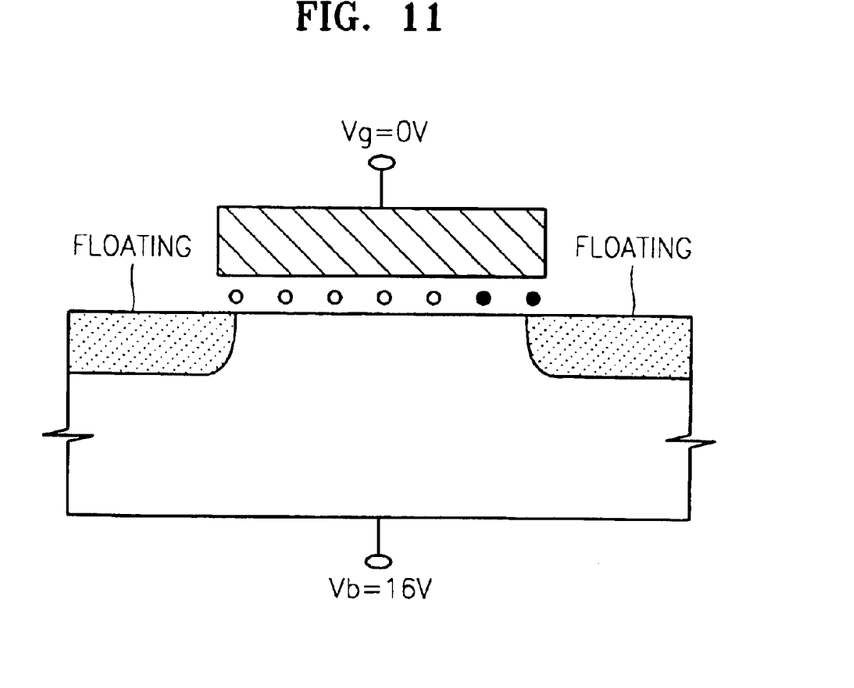
FIG. 11 is a schematic cross-sectional view illustrating the state of voltages applied to a SONOS cell in the erasing operation.
Figure 12:
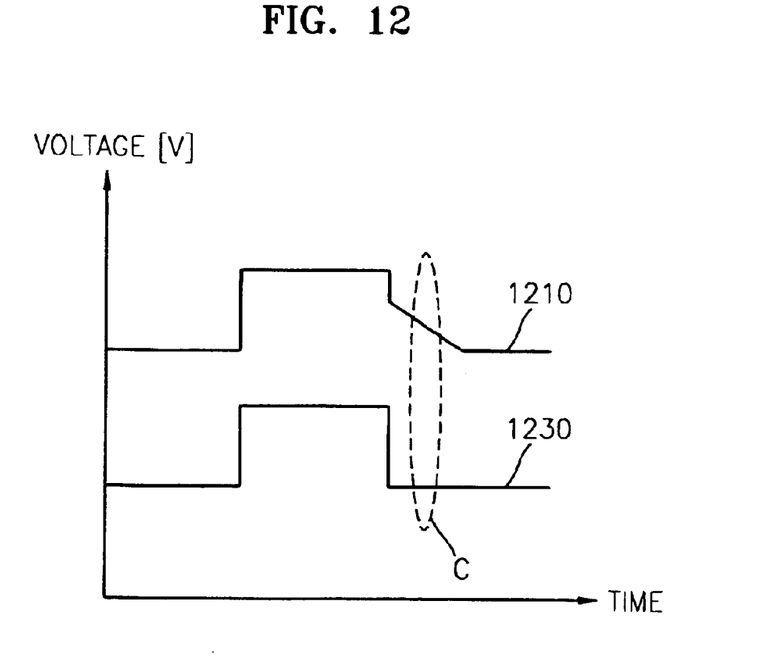
FIG. 12 is a graph schematically illustrating the state of voltages applied to a SONOS cell during a delay time in the erasing operation in the state of the applied voltages shown in FIG. 11.

FIG. 11 is a schematic cross-sectional view illustrating the state of a voltage applied to a cell during the erasing operation according to the embodiment of the present invention, and FIG. 12 is a graph schematically illustrating the state of voltages applied to a SONOS cell during a delay time in the erasing operation in the state of the applied voltages shown in FIG. 11. Referring to FIG. 11, when the erasing operation is performed by floating a bit line and a source line, applying a positive voltage of 16V to a substrate and 0V to a gate, the state of a voltage applied to a cell during a delay time is as shown in FIG. 12. Pulses of the voltage of the bit line and the source line are as shown in a line graph 1210 and pulses of the voltage of a P-type substrate are as shown in a line graph 1230.

In other words, as shown in FIG. 12, a positive voltage is applied to the bit line and the source line and the voltage of the substrate and the voltage of the gate are ground. Under these voltage conditions, hot holes occur. The hot holes are injected into a silicon oxide layer/silicon nitride layer/silicon oxide layer containing electrons trapped by the programming operation, thereby reducing the threshold voltage.

In this state, F-N tunneling and hot hole injection improve the erasing operation. Thus, the speed of the erasing operation increases.

In more detail, in a SONOS cell, when a gate is ground or supplied with a negative voltage, a positive voltage is applied to a bit line having an N+ junction. Next, a substrate doped with p-type impurity ions is ground and a backward voltage is applied between the N+ junction and a P− junction. Then, hot holes occur and are injected into a multi-layered dielectric layer, thereby reducing the threshold voltage. An erasing operation using hot hole injection in such a SONOS cell is described in a document, entitled "A True-Single Transistor Oxide-Nitride EEPROM device" by T. Y. Chan, K. K. Young, and C. Hu, IEEE, Electron device letter, vol 8, pp. 93–95, March 1987. In this document, a positive voltage is applied to a bit line from an external source, a ground voltage is applied to a substrate, hot holes occur, and the hot holes are injected into a multi-layered dielectric layer to perform the erasing operation.

However, in the present invention, the voltage of the bit line and the source line boosted by the positive voltage applied to the substrate creates hot holes which are used in the erasing operation. In other words, in the conditions suggested in the present invention, the positive voltage applied to the bit line is not necessary for the erasing operation. Thus, a circuit for generating the positive voltage is not necessary when the whole device is constituted.

Figure 13:
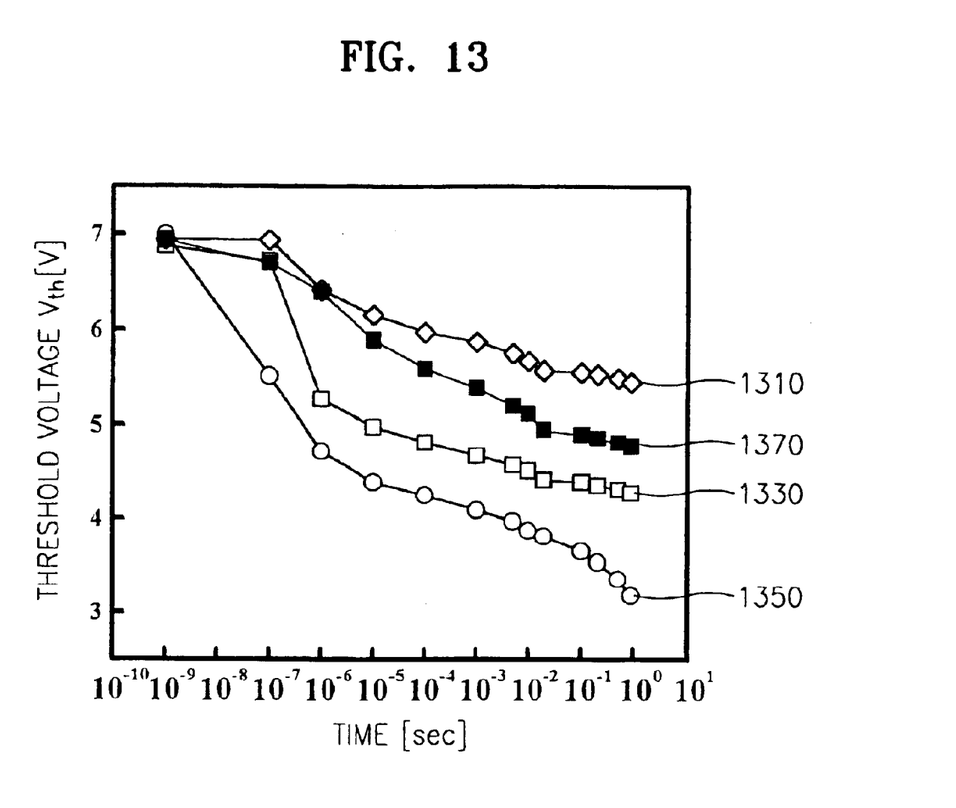
FIG. 13 is a graph illustrating speeds for erasing the SONOS cells.

The speed for the erasing operation is very fast as shown in FIG. 13.

FIG. 13 illustrates the speed for the erasing operation of a SONOS cell measured by changing the state of a voltage applied for the erasing operation. A line graph 1310 shows an erasing speed obtained when a voltage $V_b$ applied to a P-type substrate is set to 8V, a voltage $V_g$ applied to a gate is set to −6V, and a source and a bit line float. A line graph 1330 shows an erasing speed obtained when a voltage $V_b$ applied to a P-type substrate is set to 10V, a voltage $V_g$ applied to a gate is set to −4V, and a source line and a bit line float. A line graph 1350 shows an erasing speed obtained when a voltage $V_b$ applied to a P-type substrate is set to 14V, a voltage $V_g$ applied to a gate is set to 0V, and a source line and a bit line float. A line graph 1370 shows an erasing speed obtained when a voltage $V_b$ applied to a P-type substrate is set to 10V, a voltage $V_g$ applied to a gate is set to −4V, and a source line and a bit line are electrically connected to the P-type substrate. In other words, the line graph 1370 shows the erasing speed obtained under a condition that the bit line and the source line do not float differently from the line graph 1330. Here, to compare the obtained results, a voltage of 14V was applied between the P-type substrate and the gate.

Referring to FIG. 13, in the erasing operation, a ground voltage or a negative voltage is applied to a selected word line, i.e., a gate and a voltage within a range of 8–10V is applied to a substrate to reduce a threshold voltage. If the erasing operation is performed due to F-N tunneling affected by only voltages applied to the word line and the substrate, the voltages of the gate and the substrate must have the same erasing characteristic. However, as the positive voltage of the substrate is high, the threshold voltage is largely reduced. Thus, as seen in FIG. 13, hot holes affect the erasing operation.

In more description, as the positive voltage applied to the substrate is high, the voltage of the bit line and the source line is largely self-boosted and a backward voltage applied to the bit line and the substrate increases. Thus, the amount of hot holes increases, which increases the amount of injected hot holes. As a result, the erasing speed is improved as shown in FIG. 13.

Comparing the line graphs 1330 and 1370 of FIG. 13, the erasing speed varies depending on the states of the bit line and the source line in a combination state of voltages of −4 VG and 10 VB. In other words, the line graph 1370 illustrates an erasing characteristic measured by electrically connecting the substrate and the bit line/source line via the same node and applying the combination voltage. The line graph 1330 shows an erasing characteristic measured by floating the bit line/source line in the same voltage state. Comparing the line graphs 1330 and 1370, when the bit line and the source line float, i.e., in the case of the line graph 1330, the erasing characteristic is improved. The reason is why since the substrate is connected to the bit line or the source line via the same node, a backward bias is not applied between the substrate and the bit line or between the substrate and the source line. Thus, hot holes do not occur and an erasing effect due to the hot holes does not occur.

As described above, according to the present invention, when SONOS are arrayed in the NOR form to constitute a flash memory device, the flash memory device can operate using a program due to CHE injection and an erasing operation due to F-N tunneling. As a result, SONOS cells, which are formed using a simpler process and compatible with a logic process, can be used for constituting a NOR-type flash memory device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method for operating a flash memory device that is constituted by arraying silicon-oxide-nitride-oxide-semiconductor (SONOS) memory cells including a drain and a source formed in a substrate, a channel formed between the drain and the source, a gate formed over the channel, and a multi-layered dielectric layer of an oxide layer, a nitride layer, and an oxide layer formed between the gate and the substrate in the NOR form, the method comprising:

applying voltages to one selected from the SONOS memory cells and programming the selected SONOS memory cell so that hot electrons are injected into at least one of either the interface between the oxide layer and the nitride layer or into the nitride layer from the channel and trapped in at least one of either the interface between the oxide layer and the nitride layer or in the nitride layer to increase a threshold voltage; and applying a positive voltage to the substrate, at least one of either a ground voltage or a negative voltage to the gate and floating at least one of either the source or the drain to reduce the threshold voltage to perform at least one of either removing trapped electrons using Fowler-Nordheim tunneling or erasing the trapped electrons by injecting hot holes created between one of either the source and the substrate or between the drain and the substrate under a voltage condition into the multi-layered dielectric layer.

2. The method of claim 1, wherein when the selected SONOS cell is programmed, a voltage is applied to the selected SONOS cell in a condition that a voltage within a range of 8V–12V is applied to the gate of the selected SONOS cell, a voltage within a range of 3V–6V is applied to the drain, and the source is ground.

3. The method of claim 2, wherein the condition further comprises at least one of either grounding the substrate or applying a negative voltage to the substrate.

4. The method of claim 1, wherein when erasing the trapped electrons, the gate of the selected SONOS memory cell is ground and a voltage within a range of 13V–18V is applied to the substrate.

5. The method of claim 1, wherein when erasing the trapped electrons, a voltage of about −8V is applied to the gate of the selected SONOS memory cell and a voltage of about 6V is applied to the substrate.

6. The method of claim 1, wherein at least one of either removing trapped electrons using Fowler-Nordheim tunneling or erasing the trapped electrons by injecting hot holes created between one of either the source and the substrate or between the drain and the substrate under the voltage condition into the multi-layered dielectric layer further comprises both Fowler-Nordheim tunneling and by injecting hot holes.

7. A method for operating a flash memory cell that is constituted by arraying silicon-oxide-nitride-oxide-semiconductor (SONOS) memory cells including a drain and a source formed in a substrate, a channel formed between the drain and the source, a gate formed over the channel, and a multi-layered dielectric layer of an oxide layer, a nitride layer, and an oxide layer formed between the gate and the substrate in the NOR form, wherein drains of the SONOS memory cells are electrically connected to a bit line, gates of the SONOS memory cells are electrically connected to a word line crossing the bit line, sources of the SONOS memory cells connected to the word line are connected to a common source line, the method comprising:

applying a voltage to one selected from the SONOS memory cells and programming the selected SONOS memory cell so that hot electrons are injected into at least one of either the interface between the oxide layer and the nitride layer or into the nitride layer from the channel and trapped in at least one of either the interface between the oxide layer and the nitride layer or in the nitride layer to increase a threshold voltage; and applying a positive voltage to the substrate, at least one of either a ground voltage or a negative voltage to the gate and floating at least one of either the source or the bit line to reduce the threshold voltage to perform at least one of either removing the trapped electrons from the interface between the oxide layer and the nitride layer or the nitride layer using Fowler-Nordheim tunneling or erasing the trapped electrons by injecting hot holes created between at least one of either the source and the substrate or between the drain and the substrate under a voltage condition into the multi-layered dielectric layer.

8. The method of claim 7, wherein when programming the selected SONOS memory cell, the voltage is applied to the selected SONOS memory cell in a condition that a word line is selected and a voltage within a range of 8V–12V is applied to the selected word line, a bit line is selected and a voltage within a range of 3V–6V is applied to the selected bit line, and the common source line is ground.

9. The method of claim 8, wherein the condition further comprises at least one of either grounding the substrate or applying a negative voltage to the substrate.

10. The method of claim 7, wherein when erasing the trapped electrons, the word line is ground and a voltage within a range of 13V–18V is applied to the substrate.

11. The method of claim 7, wherein when erasing the trapped electrons, a voltage of about −8V is applied to the selected word line connected to the selected SONOS memory cell.

12. The method of claim 7, wherein at least one of either removing trapped electrons using Fowler-Nordheim tunneling or erasing the trapped electrons by injecting hot holes created between one of either the source and the substrate or between the drain and the substrate under the voltage condition into the multi-layered dielectric layer further comprises both Fowler-Nordheim tunneling and by injecting hot holes.

* * * * *